(12) United States Patent
Sheu et al.

(10) Patent No.: US 11,606,860 B2
(45) Date of Patent: Mar. 14, 2023

(54) FLEXIBLE CIRCUIT BOARD

(71) Applicant: CHIPBOND TECHNOLOGY CORPORATION, Hsinchu (TW)

(72) Inventors: Gwo-Shyan Sheu, Kaohsiung (TW); Hsin-Hao Huang, Kaohsiung (TW); Yu-Chen Ma, Kaohsiung (TW); Chia-Hsin Yen, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/504,635

(22) Filed: Oct. 19, 2021

(65) Prior Publication Data
US 2022/0225496 A1    Jul. 14, 2022

(30) Foreign Application Priority Data
Jan. 11, 2021   (TW) ................................ 110100920

(51) Int. Cl.
*H05K 1/02*     (2006.01)
*H05K 1/18*     (2006.01)

(52) U.S. Cl.
CPC .......... *H05K 1/0296* (2013.01); *H05K 1/028* (2013.01); *H05K 1/0268* (2013.01); *H05K 1/189* (2013.01);
(Continued)

(58) Field of Classification Search
CPC .... H05K 1/0296; H05K 1/0268; H05K 1/028; H05K 1/189; H05K 1/0281;
(Continued)

(56) References Cited

U.S. PATENT DOCUMENTS 6,495,768 B1* 12/2002 Cho ................... H01L 23/4985
                                                             174/268
11,373,943 B2* 6/2022 Chen ................... H01L 27/156
(Continued)

FOREIGN PATENT DOCUMENTS

CN          103514996 A      1/2014
JP          8-254708 A      10/1996
(Continued)

OTHER PUBLICATIONS

Taiwanese Notice of Allowance dated Sep. 24, 2021 for Taiwanese Patent Application No. 110100920, 3 pages.
(Continued)

*Primary Examiner* — Roshn K Varghese
(74) *Attorney, Agent, or Firm* — Demian K. Jackson; Jackson IPG PLLC

(57) ABSTRACT

A flexible circuit board includes a flexible substrate, a chip and a patterned circuit layer. A surface of the flexible substrate is separated into a working area and a nonworking area according to a cutting line. The chip is disposed on the working area. The patterned circuit layer is disposed on the surface and includes signal transmission wires and bypass wires, the bypass wires are not electrically connected to the chip. Each of the bypass wires includes a bypass transmission portion located on the working area and an anti-peeling portion located on the nonworking area. A blank area exists between the anti-peeling area and the bypass transmission portion, and the cutting line passes through the blank area. A distance between 100 um and 400 um exists from the anti-peeling portion to the cutting line.

16 Claims, 2 Drawing Sheets

(52) U.S. Cl.
CPC .............. *H05K 2201/09227* (2013.01); *H05K 2201/09236* (2013.01); *H05K 2201/09727* (2013.01)

(58) Field of Classification Search
CPC ................ H05K 1/0237; H05K 1/147; H05K 2201/09227; H05K 2201/09409; H05K 2201/09236; H05K 2201/09727; H05K 2201/0909; H05K 2201/09781; H05K 2201/09127; H05K 2203/0228
See application file for complete search history.

(56) References Cited

U.S. PATENT DOCUMENTS

| | | | |
|---|---|---|---|
| 2018/0068940 A1* | 3/2018 | Oh | ......................... H01L 25/18 |
| 2020/0098795 A1 | 3/2020 | Jung et al. | |
| 2021/0351119 A1 | 11/2021 | Chen | |

FOREIGN PATENT DOCUMENTS

| | | |
|---|---|---|
| JP | 2000-243788 A | 9/2000 |
| JP | 2006-196878 A | 7/2006 |
| JP | 2012-169558 A | 9/2012 |
| TW | 363333 | 7/1999 |
| TW | 201403638 A | 1/2014 |
| TW | 201534184 A | 9/2015 |

OTHER PUBLICATIONS

Japanese Notice of Allowance dated Dec. 15, 2022 for Japanese Patent Application No. 2021-185921, 3 pages.

\* cited by examiner

FLEXIBLE CIRCUIT BOARD

FIELD OF THE INVENTION

This invention relates to a flexible circuit board, and more particularly to a flexible circuit board able to protect wires from peeling during punching process.

BACKGROUND OF THE INVENTION

Flexible circuit board is a package having electronic component and traces on a flexible substrate and is widely applicable in portable electronic device due to it is bendable, light, thin and shape customizable. Single flexible circuit board is small and soft so it is difficult to be moved and processed. Consequently, reel-to-reel method is a conventional method to convey flexible circuit boards during manufacturing processes (e.g. copper plating, wire patterning, tin plating, solder resist coating, solder reflow and flip-chip bonding). The traces disposed on small-size flexible circuit board are extremely fine in width, and the fine line traces adjacent to cutting line are easily peeled away from the flexible circuit board. As a result, preventing fine line traces peeling from flexible circuit board during punching process is one important issue in yield improvement.

SUMMARY

One object of the present invention is to protect bypass transmission portion from peeling during punching process by disposing anti-peeling portion of bypass wire.

A flexible circuit board of the present invention includes a flexible substrate, a chip and a patterned circuit layer. A surface of the flexible substrate is separated into a working area and a nonworking area according to a cutting line. The chip is disposed on the working area of the surface. The patterned circuit layer is disposed on the surface and includes a plurality of signal transmission wires and bypass wires, the signal transmission wires are electrically connected to the chip and the bypass wires are not electrically connected to the chip. Each of the bypass wires includes a bypass transmission portion located on the working area and an anti-peeling portion located on the nonworking area. A blank area exists between the anti-peeling portion and the bypass transmission portion, and the cutting line passes through the blank area. A distance from the anti-peeling portion to the cutting line is between 100 um and 400 um.

In the present invention, the distance between 100 um and 400 um existing from the anti-peeling portion to the cutting line is provided to increase the support of the blank area so as to protect the bypass transmission portion from peeling during punching process and improve the overall yield of the product.

DETAILED DESCRIPTION OF THE INVENTION

Figure 1:
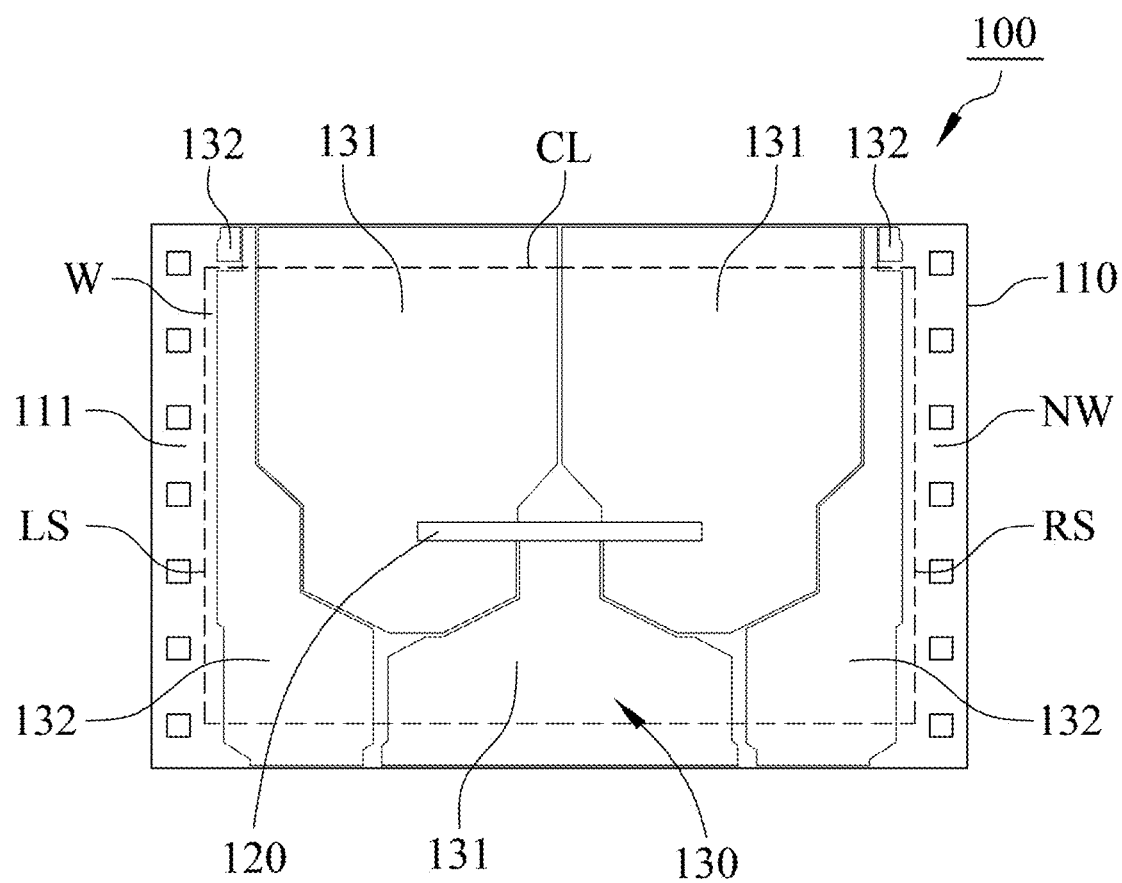
FIG. 1 is a top view diagram illustrating a flexible circuit board in accordance with one embodiment of the present invention.

FIG. 1 is a top view diagram showing a flexible circuit board 10 in accordance with one embodiment of the present invention. The flexible circuit board 100 includes a flexible substrate 110, a chip 120 and a patterned circuit layer 130.

In this embodiment, the flexible substrate 110 is made of polyimide (PI) or polyethylene terephthalate (PET). A surface 111 of the flexible substrate 110 is separated into a working area W and a nonworking area NW according to a cutting line CL. The area on the surface 111 enclosed by the cutting line CL is defined as the working area W, and the other area (except the working area W) on the surface 111 is defined as the nonworking area NW. The flexible circuit board 100 is cut along the cutting line CL in punching process, the remained working area W is used as a driver IC and the nonworking area NW is removed as waste.

The chip 120 and the patterned circuit layer 130 are disposed on the surface 111 of the flexible substrate 110, the chip 120 is located on the working area W and the patterned circuit layer 130 is located on both the working area W and the nonworking area NW. The patterned circuit layer 130 shown in FIG. 1 is simplified into outline, in practice, the patterned circuit layer 130 involves many fine wires. The patterned circuit layer 130 is formed by etching a copper layer plated or laminated on the surface 111 of the flexible substrate 110. The chip 120 is flip bonded to the patterned circuit layer 130, signal transmissions between the chip 120 and the patterned circuit layer 130 can be achieved by the eutectic bonding of the bumps (not shown) on the chip 120 and the patterned circuit layer 130. The segment of the patterned circuit layer 130 bonded to the chip 120 is an inner lead of the patterned circuit layer 130.

With reference to FIG. 1, the patterned circuit layer 130 includes a plurality of signal transmission wires 131 and bypass wires 132. The signal transmission wires 131 are electrically connected to the chip 120, and the bypass wires 132 are not electrically connected to the chip 120. In this embodiment, a part of the bypass wires 132 are close to a left side LS of the working area W and a part of the bypass wires 132 are close to a right side RS of the working area W such that the signal transmission wires 131 are located between the bypass wires 132. Owing to the bypass wires 132 are not electrically connected to the chip 120, signal(s) can be transmitted via the bypass wires 132 and not through the chip 120.

Figure 2:
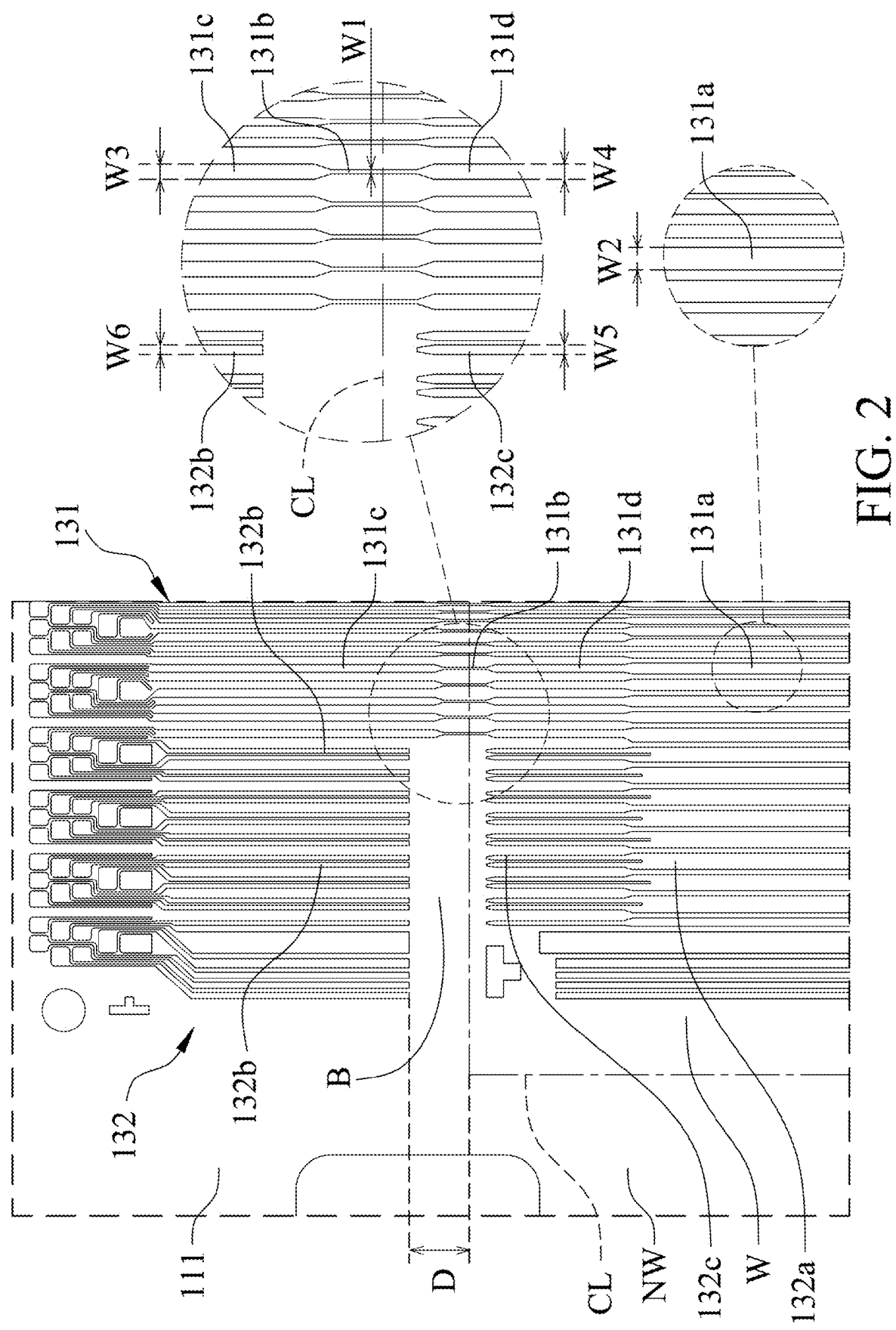
FIG. 2 is a top view enlarged diagram illustrating a part of the flexible circuit board in accordance with one embodiment of the present invention.

FIG. 2 is an enlarged diagram showing a part of the flexible circuit board 100 shown in FIG. 1. Each of the signal transmission wires 131 includes a transmission portion 131a, a reduced portion 131b and a test portion 131c. The transmission portion 131a is located on the working area W, and both ends of the transmission portion 131a are the inner lead and an outer lead respectively. The inner lead is provided to electrically connect to the chip 120, the outer lead is close to the cutting line CL and is provided to electrical connect to a panel or a drive circuit board after cutting the flexible circuit board 100 from tape. The test portion 131c is located on the nonworking area NW and is electrically connected to the transmission portion 131a via the reduced portion 131b. Before cutting the flexible circuit board 100 from tape, the test portion 131c is provided for contacting with the probe of probe card so as to test the function of the transmission portion 131a. The reduced portion 131b is connected to and located between the transmission portion 131a and the test portion 131c, and the reduced portion 131b is located on the area where the cutting line CL passes through. A width W1 of the reduced portion 131b is less than a width W2 of the transmission portion 131a and a width W3 of the test portion 131c. Owing to the flexible circuit board 100 is cut along the cutting line CL, the reduced portion 131b having a less width W1 can reduce abrasion or wear on the punch tool used in the punching process. In this embodiment, the width W1 of the reduced portion 131b is between 8 um and 13 um such that it is possible to ensure sufficient bonding strength between the reduced portion 131b and the flexible substrate 110 and reduce the abrasion or wear on the punch tool simultaneously. In other embodiment, the width W1 of the reduced portion 131b is equal to the widths W2 and W3 of the transmission portion 131a and the test portion 131c. The width W1 of the reduced portion 131b of the present invention may less than, greater than or equal to the widths W2 and W3 of the transmission portion 131a and the test portion 131c.

Preferably, the signal transmission portion 131 of this embodiment further includes a pre-reduced portion 131d located on the working area W. The pre-reduced portion 131d is connected to and located between the reduced portion 131b and the transmission portion 131a. In this embodiment, a width W4 of the pre-reduced portion 131d is greater than the width W1 of the reduced portion 131b and less than the width W2 of the transmission portion 131a. Because of the pre-reduced portion 131d, the transmission portion 131a is not connected to the reduced portion 131b directly so as to avoid current crowding caused by a too large change of line width. The widths W3 and W4 of the test portion 131c and the pre-reduced portion 131d of the same signal transmission wire 131 are equal, and the widths W3 and W4 are between 10 um and 30 um.

With reference to FIG. 2, each of the bypass wires 132 includes a bypass transmission portion 132a located on the working area W and an anti-peeling portion 132b located on the nonworking area NW. The bypass transmission portion 132a of each of the bypass wires 132 is not connected to the chip 120 and does not require to be tested so a blank area B exists between the anti-peeling portion 132b and the bypass transmission portion 132a. The cutting line CL passes through the blank area B which is provided to further reduce abrasion or wear of the punch tool during punching process.

With reference to FIG. 2, in this embodiment, the bypass transmission portion 132a of each of the bypass wires 132 includes a width-reduced segment 132c that is close to the cutting line CL. A width W5 of the width-reduced segment 132c is less than a width of the other segment(s) of the bypass transmission portion 132a. The width W5 of the width-reduced segment 132c is equal to a width W6 of the anti-peeling portion 132b of the same bypass wire 132, and the widths W5 and W6 of the width-reduced segment 132c and the anti-peeling portion 132b are between 10 um and 150 um. The width-reduced segment 132c having a narrower width W5 is weakly bonded to the flexible substrate 110 and not connected to the anti-peeling portion 132b, for this reason, it may be damaged while the flexible circuit board 100 is cut along the cutting line CL. Preferably, a distance D between 100 um and 400 um exists from the anti-peeling portion 132b and the cutting line CL such that the anti-peeling portion 132b can support the blank area B and avoid deformation of the blank area B during punching process. Furthermore, the width-reduced segment 132c of the bypass transmission portion 132a is protected from peeling during punching process.

In other embodiment, similar to the signal transmission wires 131, the width-reduced segment 132c also includes a bypass reduced portion and a bypass pre-reduced portion (not shown). The bypass reduced portion is located between the bypass pre-reduced portion and the blank area B, the bypass reduced portion is narrower than the bypass pre-reduced portion in width and more easily damaged by punching. Consequently, the anti-peeling portion 132b can provide better protection for the width-reduced segment 132c.

Owing to the distance D between 100 um and 400 um existing from the anti-peeling portion 132b and the cutting line CL, the blank area B is supported to prevent the bypass transmission portion 132b from peeling during punching process such that the overall yield of product can be increased.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A flexible circuit board comprising:
 a flexible substrate having a surface separated into a working area and a nonworking area according to a cutting line;
 a chip disposed on the working area of the surface; and
 a patterned circuit layer disposed on the surface and including a plurality of signal transmission wires and a plurality of bypass wires, the plurality of signal transmission wires are electrically connected to the chip and the plurality of bypass wires are not electrically connected to the chip, each of the plurality of bypass wires includes a bypass transmission portion located on the working area and an anti-peeling portion located on the nonworking area, a blank area exists between the anti-peeling portion and the bypass transmission portion and the cutting line is configured to pass through the blank area, wherein a distance from the anti-peeling portion to the cutting line is between 100 um and 400 um,
 wherein the bypass transmission portion of each of the plurality of bypass wires includes a width-reduced segment which is close to the cutting line, a width of the width-reduced segment is less than a width of the other segment(s) of the bypass transmission portion.

2. The flexible circuit board in accordance with claim 1, wherein the width of the width-reduced segment is equal to a width of the anti-peeling portion of the same bypass wire.

3. The flexible circuit board in accordance with claim 2, wherein the width of the width-reduced segment is between 10 um and 150 um.

4. The flexible circuit board in accordance with claim 1, wherein the width of the width-reduced segment is between 10 um and 150 um.

5. The flexible circuit board in accordance with claim 1, wherein each of the plurality signal transmission wires includes a transmission portion, a reduced portion and a test portion, the transmission portion is located on the working area, the test portion is located on the nonworking area, the reduced portion is connected to and located between the transmission portion and the test portion, the cutting line is configured to pass through the reduced portion, and a width of the reduced portion is less than a width of the transmission portion and a width of the test portion.

6. The flexible circuit board in accordance with claim 5, wherein the width of the reduced portion is between 8 um and 13 um.

7. The flexible circuit board in accordance with claim 6, wherein each of the plurality of signal transmission wires further includes a pre-reduced portion located on the working area, the pre-reduced portion is connected to and located between the reduced portion and the transmission portion, a width of the pre-reduced portion is greater than the width of the reduced portion and less than the width of the transmission portion.

8. The flexible circuit board in accordance with claim 7, wherein the widths of the test portion and the pre-reduced portion of the same signal transmission wire are equal.

9. The flexible circuit board in accordance with claim 8, wherein the width of the pre-reduced portion is between 10 um and 30 um.

10. The flexible circuit board in accordance with claim 7, wherein the width of the pre-reduced portion is between 10 um and 30 um.

11. The flexible circuit board in accordance with claim 1, wherein a part of the plurality of bypass wires are close to a left side of the working area and a part of the plurality of bypass wires are close to a right side of the working area, the plurality of signal transmission wires are located between the plurality of bypass wires.

12. A flexible circuit board comprising:
a flexible substrate having a surface separated into a working area and a nonworking area according to a cutting line;
a chip disposed on the working area of the surface; and
a patterned circuit layer disposed on the surface and including a plurality of signal transmission wires and a plurality of bypass wires, the plurality of signal transmission wires are electrically connected to the chip and the plurality of bypass wires are not electrically connected to the chip, each of the plurality of bypass wires includes a bypass transmission portion located on the working area and an anti-peeling portion located on the nonworking area, a blank area exists between the anti-peeling portion and the bypass transmission portion and the cutting line is configured to pass through the blank area, wherein a distance from the anti-peeling portion to the cutting line is between 100 um and 400 um,
wherein each of the plurality signal transmission wires includes a transmission portion, a reduced portion and a test portion, the transmission portion is located on the working area, the test portion is located on the nonworking area, the reduced portion is connected to and located between the transmission portion and the test portion, the cutting line is configured to pass through the reduced portion, and a width of the reduced portion is less than a width of the transmission portion and a width of the test portion,
wherein the width of the reduced portion is between 8 um and 13 um.

13. The flexible circuit board in accordance with claim 12, wherein each of the plurality of signal transmission wires further includes a pre-reduced portion located on the working area, the pre-reduced portion is connected to and located between the reduced portion and the transmission portion, a width of the pre-reduced portion is greater than the width of the reduced portion and less than the width of the transmission portion.

14. The flexible circuit board in accordance with claim 13, wherein the widths of the test portion and the pre-reduced portion of the same signal transmission wire are equal.

15. The flexible circuit board in accordance with claim 14, wherein the width of the pre-reduced portion is between 10 um and 30 um.

16. The flexible circuit board in accordance with claim 13, wherein the width of the pre-reduced portion is between 10 um and 30 um.

* * * * *